United States Patent
Kruger et al.

(10) Patent No.: US 7,913,197 B1
(45) Date of Patent: Mar. 22, 2011

(54) METHOD FOR DOUBLE PATTERNING LITHOGRAPHY

(75) Inventors: Michiel Victor Paul Kruger, Berkeley, CA (US); Bayram Yenikaya, San Jose, CA (US); Anwei Liu, Fremont, CA (US); Abdurrahman Sezginer, Monte Sereno, CA (US); Wolf Staud, Redwood City, CA (US)

(73) Assignee: Cadence Design Systems, Inc., San Jose, CA (US)

(*) Notice: Subject to any disclaimer, the term of this patent is extended or adjusted under 35 U.S.C. 154(b) by 553 days.

(21) Appl. No.: 12/035,413

(22) Filed: Feb. 21, 2008

Related U.S. Application Data

(60) Provisional application No. 60/890,971, filed on Feb. 21, 2007.

(51) Int. Cl.
  *G06F 17/50* (2006.01)
  *G06F 19/00* (2011.01)
  *G03F 1/00* (2006.01)
  *G21K 5/00* (2006.01)

(52) U.S. Cl. .............. 716/53; 716/54; 716/55; 716/119; 700/98; 700/120; 700/121; 430/5; 378/35

(58) Field of Classification Search ............... 716/9, 10, 716/21; 700/98, 120, 121; 430/5; 378/35
See application file for complete search history.

(56) References Cited

U.S. PATENT DOCUMENTS 5,059,359 A * 10/1991 Hull et al. ............... 264/401
6,600,965 B1 * 7/2003 Hull et al. ............... 700/120

FOREIGN PATENT DOCUMENTS

JP  56054039 A * 5/1981
JP  01290078 A * 11/1989

* cited by examiner

*Primary Examiner* — Phallaka Kik
(74) *Attorney, Agent, or Firm* — Sheppard Mullin Richter & Hampton LLP

(57) ABSTRACT

According to various embodiments of the invention systems and methods for multiple pattern lithography, wherein a target layout pattern that is not capable of being printed in one lithography step is decomposed into multiple patterns that are printable in one lithography operation and, when appropriate, a continuous junction is utilized for where patterns overlap. In a further embodiment, where a continuous junction is not utilized, a splice is utilized at overlap locations. In yet another embodiment, where splices are utilized for overlap locations, identifying where critical nets are located in the target layout pattern, determining how close a component of the critical net is to a splice, and changing the target layout pattern as to avoid the condition of a component of the critical net being in proximity to a splice. In another embodiment of the invention, where splices are utilized at overlap locations, placing a landing pad of contacts or vias at the same location as the splice.

24 Claims, 9 Drawing Sheets

METHOD FOR DOUBLE PATTERNING LITHOGRAPHY

CROSS-REFERENCE TO RELATED APPLICATION

This application claims the benefit of U.S. Provisional Application No. 60/890,971 filed Feb. 21, 2007.

TECHNICAL FIELD

The present invention relates to device manufacturing, and more particularly, some embodiments relate to semiconductor device lithography techniques.

DESCRIPTION OF THE RELATED ART

Integrated circuits, or ICs, are generally created by patterning a plurality of devices and their interconnects onto a substrate such as a semiconductor wafer. This process generally starts with a design for the circuit or circuits that will make up the IC. A top-down design methodology is commonly employed using hardware description languages (HDLs), such as Verilog®, RTM® or VHSIC hardware description language (VHDL), for example. Through the use of HDLs, the designer creates an integrated circuit by hierarchically defining functional components of the circuit.

From the HDL or other high-level description, the actual logic cell implementation may be determined by logic synthesis, which converts the functional description of the circuit into a specific circuit implementation. The logic cells are then assigned physical locations in the device layout and their interconnections are defined. This is sometimes referred to as layout and routing. The placement and routing tools used by designers generally accept as their input a flattened netlist that has been generated by the logic synthesis process. This flattened netlist identifies the specific logic cell instances from a target standard cell library, and describes the specific cell-to-cell connectivity. By application of a physical design process, the logic cells of the netlist file are placed and routed, resulting in a layout file. This layout, then, can be transferred or applied to the semiconductor substrate in a series of layers that collectively will form the devices that make up the components of the integrated circuit.

A process by which such layers are patterned on the substrate is known as photolithography, also known as optical lithography. During photolithography, a series of photomasks created from the layout file are used to transfer the layout onto the substrate layer by layer. There are different types of photomasks including binary, chrome-on-glass, attenuated phase-shifting masks (attPSM) and alternating phase-shifting masks (altPSM). A photomask, or more simply a mask, provides an image of the physical geometries of its associated integrated circuit layer or parts of a layer. Passing light through transparent sections defined by the mask elements transfers the layout pattern for the associated layer onto the wafer. The light pattern is passed through an imaging lens system and focused at the desired size on the wafer surface. A typical photolithography system uses UV light energy to project the mask pattern onto the wafer surface. The projected light pattern interacts with a photosensitive coating on the wafer and, depending on the coating used; it can be cured or rendered susceptible to removal as a result of the exposure. Accordingly, the projection of the mask pattern onto the coating can be used to transfer the pattern to the wafer.

With a continuing desire to provide greater functionality in smaller packages and the evolution of more complex system-on-chip and mixed-signal designs, IC feature geometries are being driven to smaller and smaller dimensions. Also, the shrinking of feature dimensions can lead to an increase of the number of chips that can be obtained from a given wafer. However, the ability to project an accurate image of increasingly smaller features onto the wafer is limited by the wavelength of the light used, and the ability of the lens system to capture enough diffraction orders from the illuminated mask.

The minimum feature size that a projection system can print can be approximated by its pitch (the sum of width of a feature and the spacing between the features):

$$F = k1^* \frac{\lambda}{NA}$$

where F is the minimum feature size, k1 is a coefficient of process-related factors, $\lambda$ is the wavelength of light used and NA is the numerical aperture of the lens as seen from the wafer. Using currently available exposure tools, k1 is limited to 0.25 (for a single exposure). With lithography processes using deep ultraviolet (DUV) light with wavelengths of 248 to 193 nm, minimum feature sizes of approximately 50 nm can be achieved. Accordingly, the resolution limit of conventional optical lithography technology is increasingly being challenged by the sub wavelength, or low-k1, dimensions of the critical IC feature geometries.

Not only are the critical dimension feature geometries decreasing in size in accordance with, or even faster than, Moore's Law predictions, the already large number of these feature geometries is growing at a dramatic rate as well. Furthermore, due to the necessity to mitigate optical proximity effect distortions through resolution enhancement techniques at the mask level, the overall polygonal Figure count is skyrocketing. These critical feature geometries are patterned far more precisely as well due to the severity and sensitivity of the non-linear imaging. Extreme precision is required for sub wavelength, or low-k1, applications due to highly non-linear imaging behaviors, which often magnify mask errors by large factors and in non-intuitive manners.

With current lithography technology at wavelengths of 193 nm, optical characteristics of the light are affecting the ability to decrease feature sizes. One approach to increasing resolution is to move to a smaller wavelength of light. For example, some approaches have moved to light in approximately the 13.5 nm extreme UV range. However, such trends have proven difficult for a number of reasons and designers have moved to non-lithographic enhancements to increase pattern density.

One class of technologies presently used to enhance feature density is referred to as double patterning or multiple patterning. There are several types of double patterning in use, the four most common being: double exposure, spacer mask, heterogeneous mask, and intermediate pattern accumulation.

In general, when optical lithography cannot print a target pattern in one step with a pitch less than $\lambda/2(NA)$, multiple patterning is utilized to print the target pattern. The pitch, also known as spatial period, is the sum of the width of a feature and the spacing between two features. The unprintable target pattern which is not printable in a single lithography step is decomposed into multiple patterns of smaller pitches that can be printed by a single lithography step. In the case of double patterning, the target pattern is decomposed into a first pattern and a second pattern.

For example, to print a line grating, the first, third, fifth, etc. lines are placed on a first mask while the second, fourth, sixth, etc. lines are placed on a second mask. Typically, the pitch of the pattern on each mask is double the pitch of the target pattern. The photoresist on a wafer is first exposed by optical lithography using the first mask. The first pattern is then etched into a hard mask coated over the wafer. Next, an anti-reflective coating and photoresist layer are coated onto the patterned wafer. This photoresist layer is now exposed by optical lithography using the second mask. The second pattern is then etched into the hard mask coating the wafer. The result is a hard mask that has the union of the first and the second pattern. This resulting union is transferred into a layer, such as a poly-silicon layer, underlying the hard mask by an etch process.

Currently, with multiple patterning lithography, when a first pattern and the second pattern need to overlap to maintain electrical continuity according to the target pattern, the features of the two layers are overlapped using a splice. A splice is where the pattern is broken or discontinued. In the case of double patterning, the splice is created by having a portion of the first pattern and a portion of the second pattern overlap and then having the first pattern, the second pattern, or both patterns discontinue.

BRIEF SUMMARY OF EMBODIMENTS OF THE INVENTION

According to various embodiments of the invention systems and methods for multiple pattern lithography, wherein a target layout pattern that is not capable of being printed in one lithography step is decomposed into multiple patterns that are printable in one lithography operation.

In one embodiment of the invention, a target layout pattern is decomposed into a first pattern and a second pattern, wherein the first pattern and second pattern are capable of being printed in one lithography operation. Furthermore, when appropriate, a continuous junction is utilized for where patterns overlap. In a further embodiment, where a continuous junction is not utilized, a splice is utilized for where patterns overlap.

In yet another embodiment, where splices are utilized for where patterns overlap, identifying where critical nets are located in the target layout pattern, determining how close a component of the critical net is to a splice, and changing the target layout pattern as to avoid the condition of a component of the critical net being in proximity to a splice.

In another embodiment of the invention, where splices are utilized where patterns overlap, placing a landing pad of contacts or vias at the same location as the splice.

In yet another embodiment of the invention, the systems and methods described herein performed by a computer program product. In yet a further embodiment of the invention, the systems and methods described herein performed as operations of a computed aided design apparatus for generating a data file for a layer of semiconductor device.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following Figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

The Figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed in various embodiments toward semiconductor devices and systems and methods for semiconductor layout design and processing. Particularly, some embodiments relate to multiple patterning lithography for semiconductor design and processing.

In one embodiment, double patterning technology can be used to create integrated circuit (IC) devices in accordance with the systems and methods of the invention. For example one embodiment is a process that can be used with a design tool to improve performance or yield. According to some embodiments, the tool can be configured to take in a dataset defining a target layout lithography pattern, decompose the pattern into multiple separate patterns, identify overlap locations between the separate patterns, and utilize a continuous junction at such locations.

Figure 1:
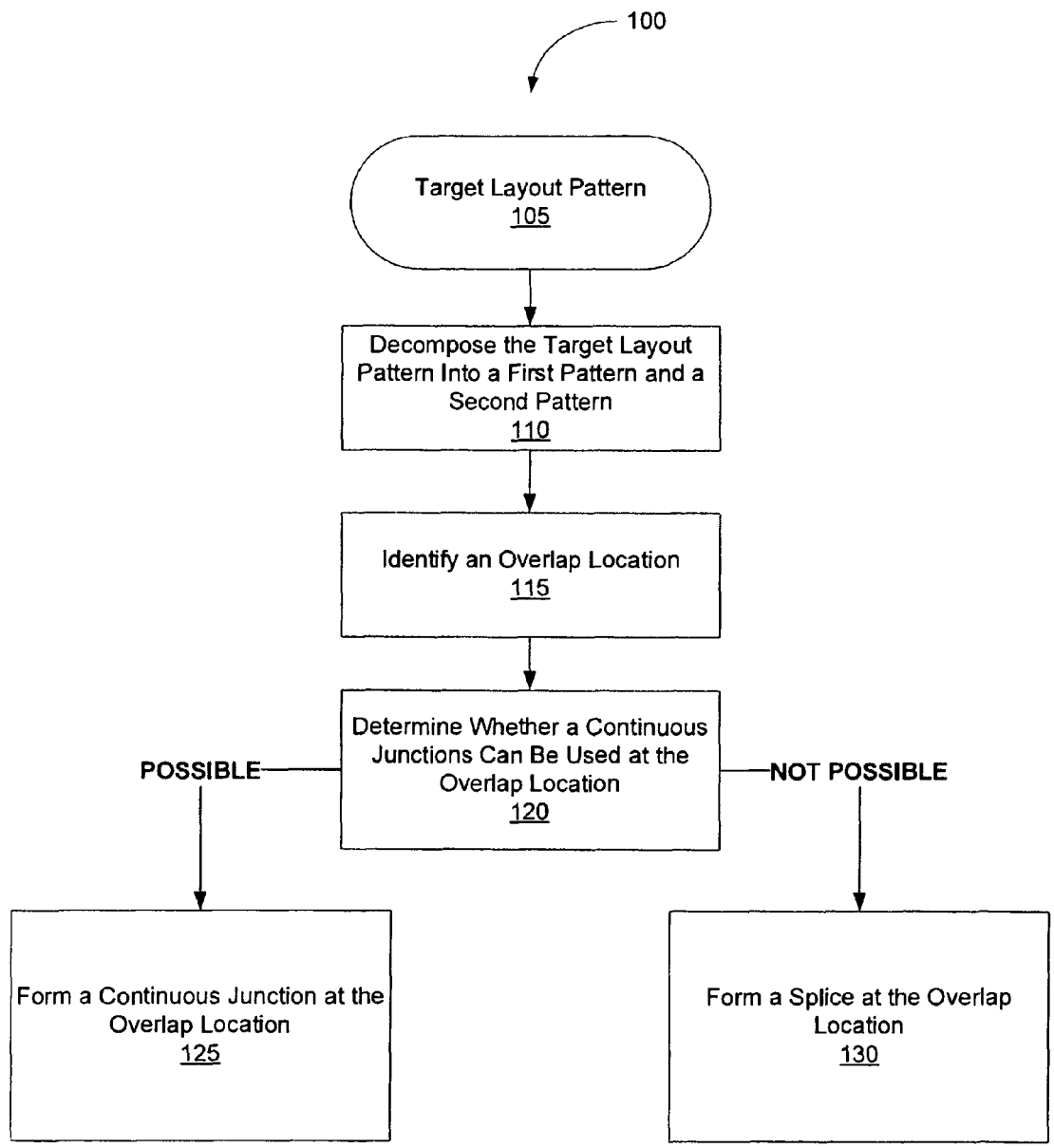
FIG. 1 is a flowchart illustrating an example method for double patterning lithography using continuous junctions.
Figure 4:
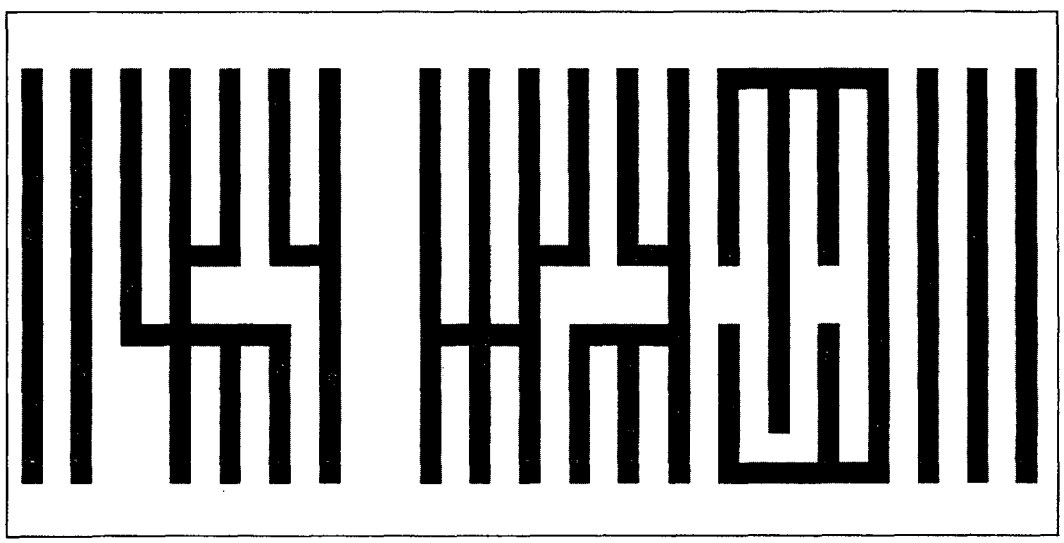
FIG. 4 is a depiction illustrating an example of a desired target layout pattern to be written by lithography.

FIG. 1 is a flowchart illustrating an example method for double patterning lithography using continuous junctions. The double patterning lithography method 100 begins at block 105 with a target layout pattern. The target layout pattern can include, but is not limited to, an integrated circuit such as a central processing unit (CPU) or a graphics processing unit (GPU). In some embodiments, the target layout pattern is defined by a dataset. FIG. 4 is a depiction illustrating an example of a desired target layout pattern to be written by lithography.

The target layout pattern is decomposed into a first pattern and a second pattern at block 110. In some embodiments, the first pattern and the second pattern are of double the pitch of the target layout pattern as to make it sufficient pitch to be printed in one lithography step. In yet other embodiments, the first pattern and the second pattern are created such that disjoint polygons of the pattern are sufficiently far away from each other. In some of those embodiments, sufficiently far away means larger than a predetermined distance such as $0.30\lambda/(N_A)$, while in other embodiments, sufficiently far away means achieving an image slope of d(Intesity)/dx that exceeds a predetermined value at the edges of the photoresist pattern.

Figure 5:
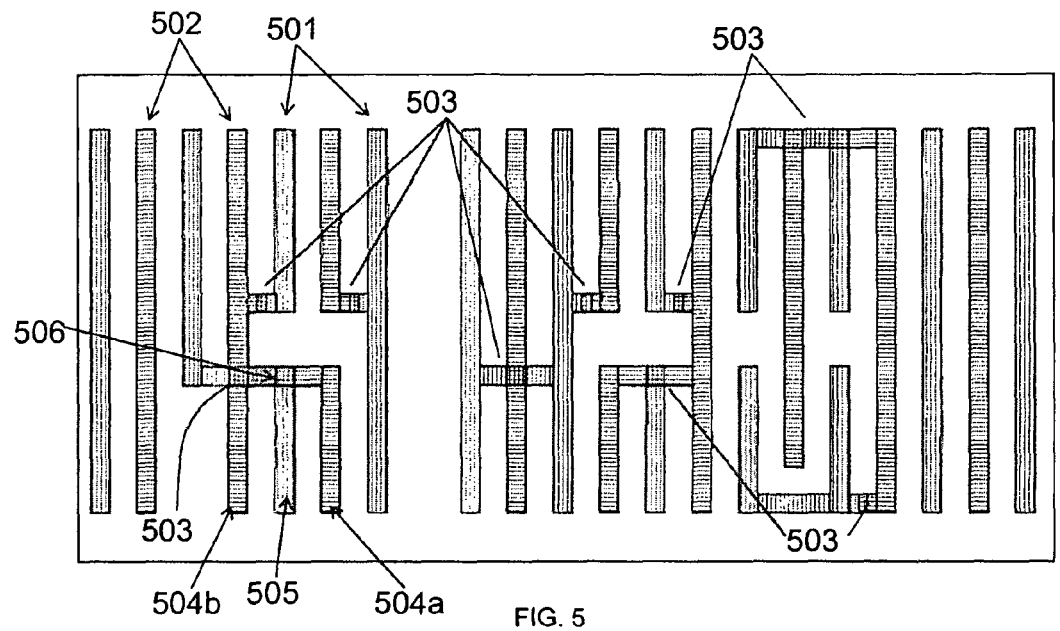
FIG. 5 is a depiction illustrating an example of the target layout pattern of FIG. 4 decomposed into a first pattern and a second pattern.

FIG. 5 is a depiction illustrating an example of the target layout pattern of FIG. 4 decomposed into a first pattern 501 and a second pattern 502. In this example, both the first pattern 501 and the second pattern 502 have features selected such that the disjoint polygons are sufficiently far away from each other.

In typical circuit designs, there are locations on the layout pattern where the first pattern and the second pattern need to overlap to maintain electrical continuity to accomplish the circuit objectives. Such locations are also referred to as overlap locations. An example of this is illustrated in FIG. 5 where the second pattern 502 overlaps the first pattern 501 at locations designated by element 503. In an embodiment of the invention, these overlap locations are identified (block 115) and followed by a determination of whether a continuous junction may be utilized for the overlap (block 120).

In such embodiments, if a continuous junction can be used, it is created by continuing an adjacent feature in the first pattern through an overlap location with the second pattern (block 125). For example, FIG. 5 illustrates an overlap location 506 where the goal is to have an electrical connection between a feature of the first pattern 501 and a feature of the second pattern 502. In FIG. 5, features 504a and 504b describe adjacent features that belong to the second pattern 502, while feature 505 describes a feature that belongs to the first pattern 501. In order to form a junction between the second pattern 502 and the first pattern 501 at overlap location 506, the adjacent features of 504a and 504b are continued through the junction at overlap location 506. Further examples of such continuous junctions are illustrated in FIG. 6.

In some embodiments of the invention, when a continuous junction cannot be utilized, a splice is utilized instead (block 130) by overlapping a portion of the first pattern with a portion of the second pattern. Such an instance includes, but is not limited to, when the continuous junction is not geometrically feasible in the target layout pattern. The method of FIG. 1 can continue this process for some or all identified overlap locations.

Figure 6:
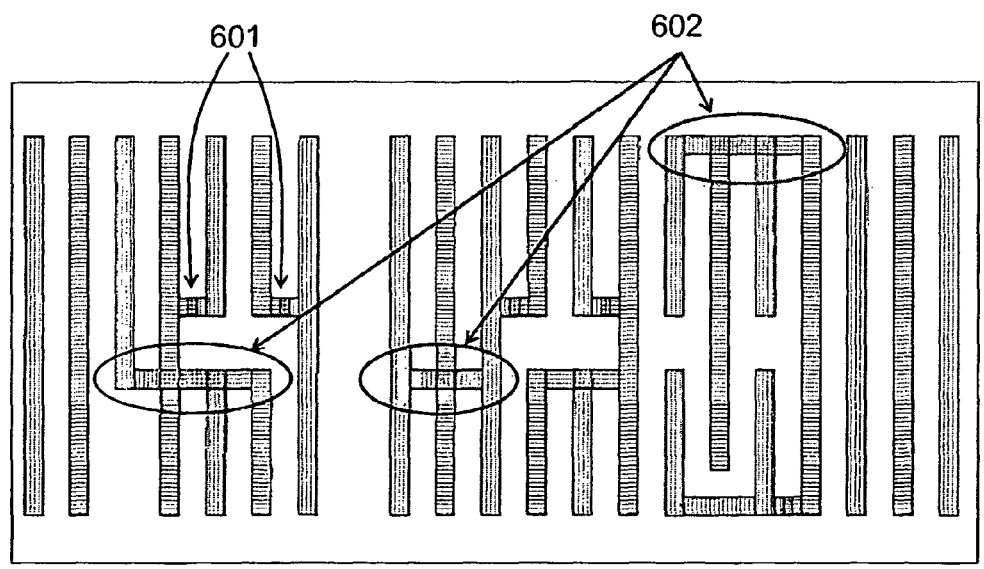
FIG. 6 is a depiction illustrating an example of the target layout pattern of FIG. 4 decomposed into a first pattern and second pattern.

FIG. 6 is a depiction illustrating an example of the target layout pattern of FIG. 4 decomposed into a first pattern and second pattern. Element 602 designates locations where each feature in the first pattern and each feature of the second pattern are continued through the junction. In an embodiment of the invention, continuous junctions are used when they can be used to avoid splices 601, which frequently compromise the quality of the lithography image.

Splices are created by having the feature of one pattern protrude out sufficiently enough for it to overlap with the feature of the other pattern to create electrical continuity. Element 601 of FIG. 6 illustrates an example of a splice. Splices are difficult to achieve because of process variables and other factors. For example, whether a feature protrudes sufficiently outward depends on many variations which include, but are not limited to, focus of the lithography machines, effective exposure dose, and over-layer issues. In addition, low dimension control can cause the definition of the line edges to suffer. Even when a splice has been achieved, it runs the risk of becoming disconnected. These issues can be reduced or even avoided in various embodiments when continuous junctions, as opposed to splices, are utilized, at least where possible or practical.

Figure 7:
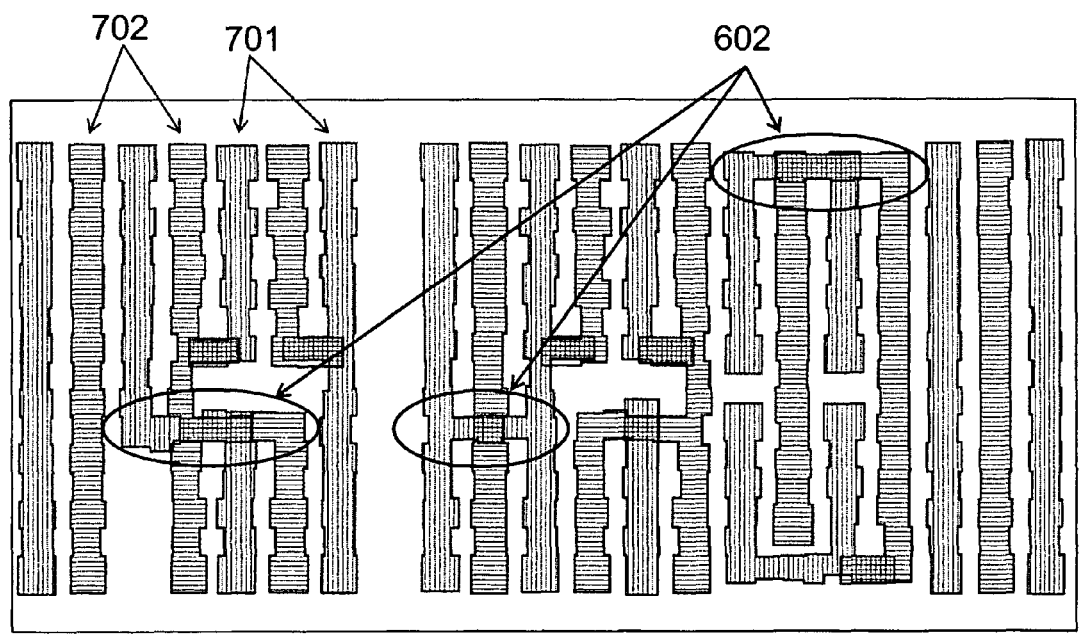
FIG. 7 is a depiction illustrating an example of the target layout pattern of FIG. 4 decomposed into a first mask and a second mask using process proximity compensation (PPC).
Figure 8A:
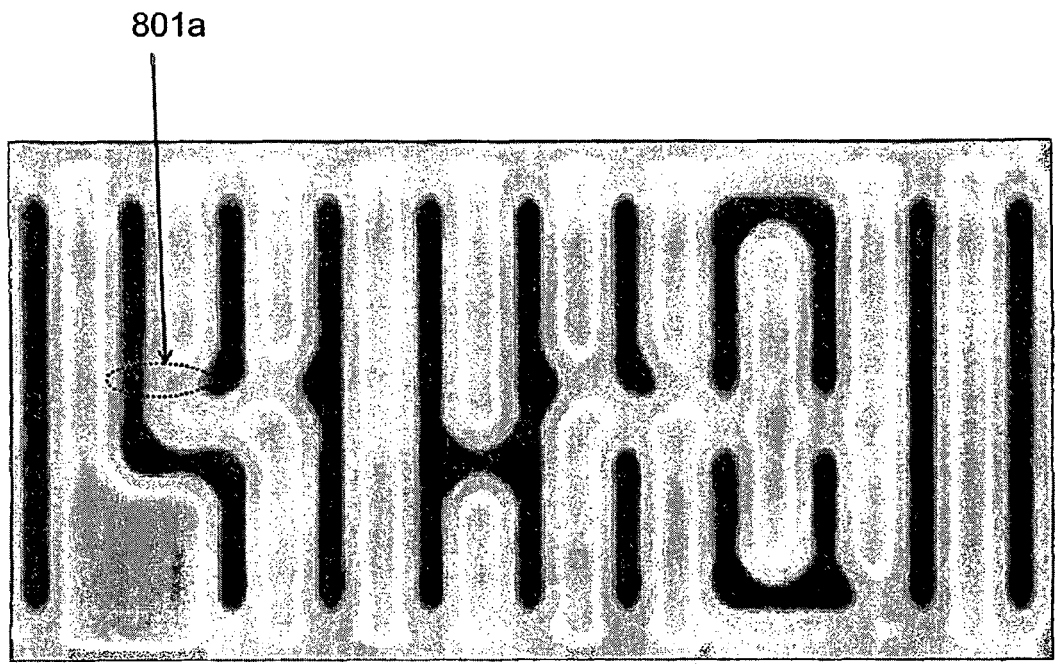
FIG. 8a is an example of an image intensity generated by the first mask of FIG. 7.
Figure 8B:
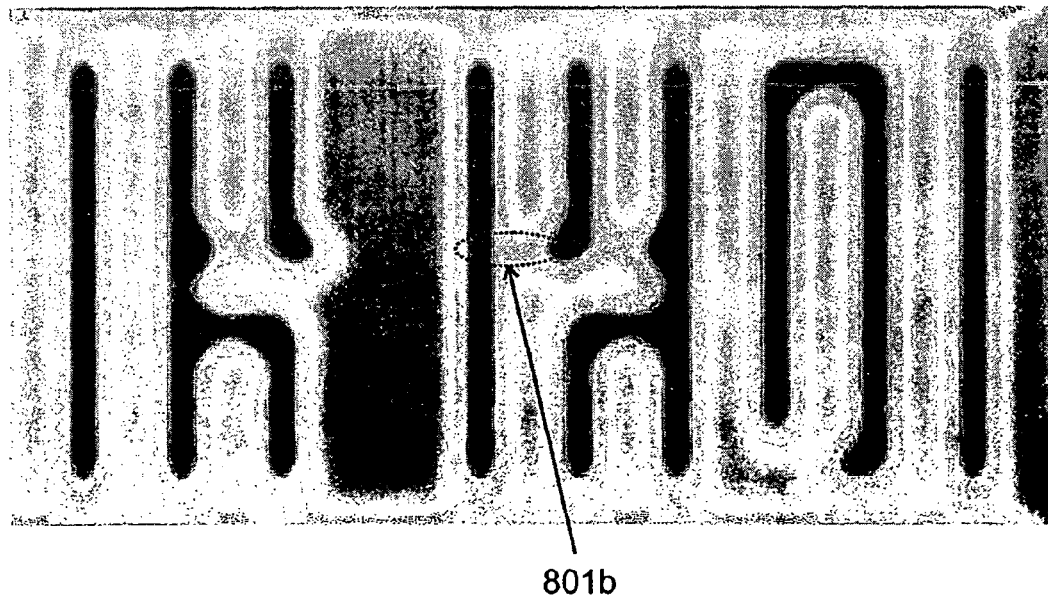
FIG. 8b is an example of an image intensity generated by the second mask of FIG. 7.

Once the target layout pattern is decomposed into a first pattern and a second pattern, the photolithography process continues. For example, the first and second patterns are compensated according to resolution enhancement techniques (RET), and either optical proximity correction (OPC) or process proximity compensation (PPC). As seen in FIG. 7, this creates the mask polygons of the first pattern 701 and second pattern 702, respectively. FIGS. 8a and 8b show the in-resist image intensity of the first exposure using the first photomask 701 and the second exposure using second photomask 702. Elements 801a and 801b illustrate how the image slope next to the splices is low, which results in higher mask error enhancement at such locations. Hence, in accordance with an embodiment of this invention, when a critical net is determined to be in proximity of a splice, the target layout pattern can be changed to reduce or avoid this condition. Examples of how such a condition can be reduced or avoided can include, but are not limited to, moving the critical net in the target layout pattern, using a continuous junction in place of a splice, redefining the target layout pattern such that it can be implemented to avoid critical nets being placed by overlap locations, or avoiding splices near critical net locations.

Figure 2:
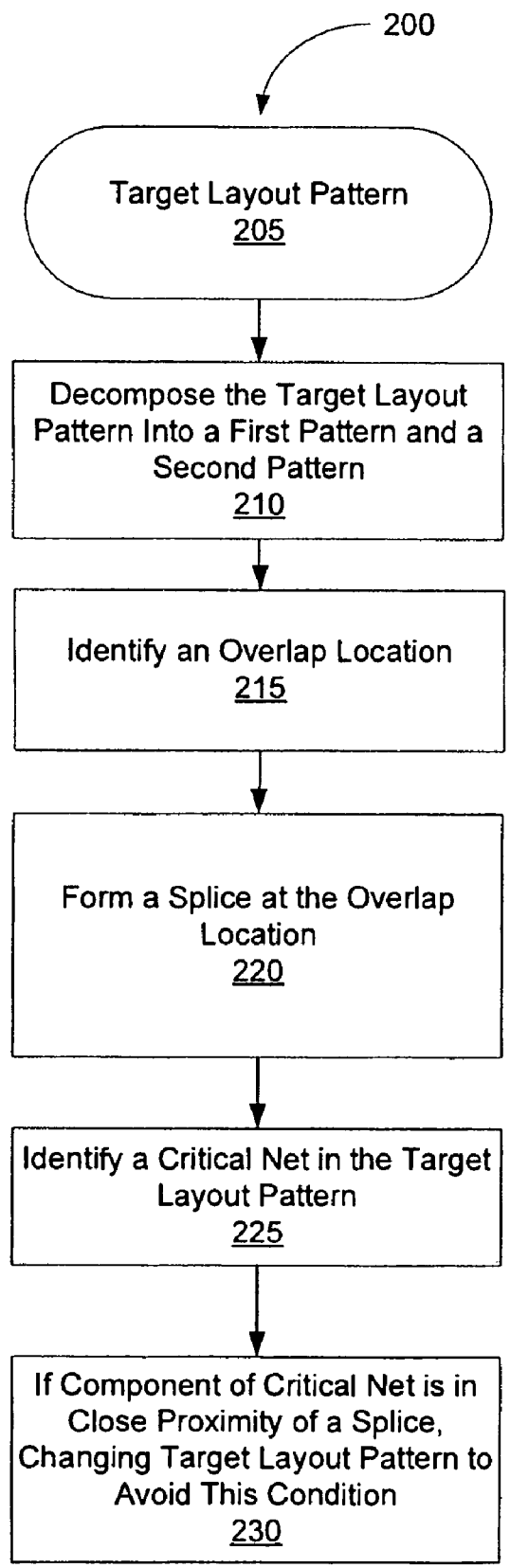
FIG. 2 is a flowchart illustrating an example method for double patterning lithography optimized for critical net positioning.
Figure 10:
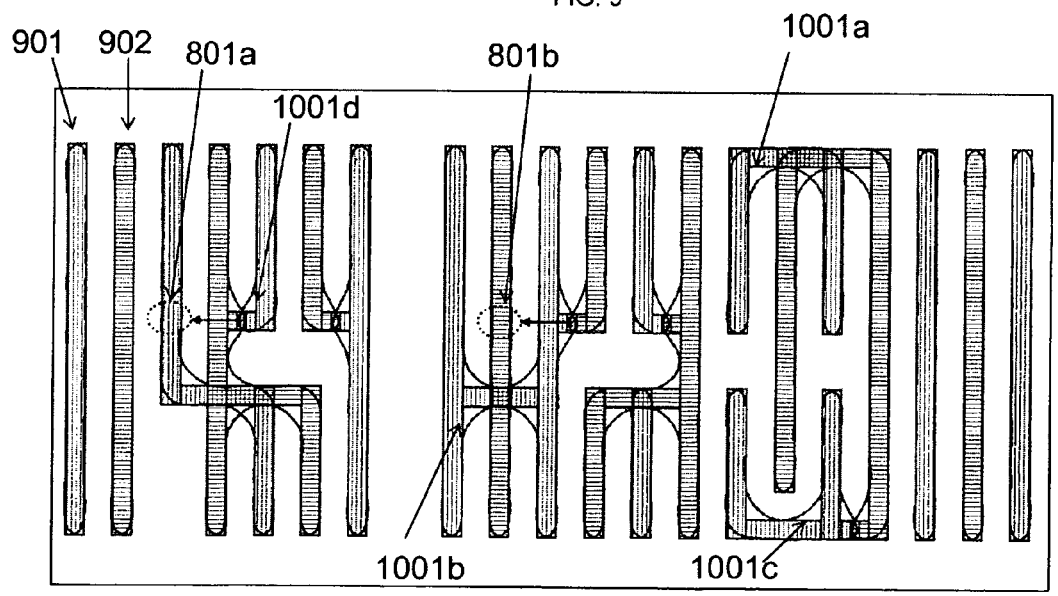
FIG. 10 is the etch contour of FIG. 9 superimposed with the first pattern and the second pattern of FIG. 5.

FIG. 2 is a flowchart illustrating an example method for double patterning lithography optimized for critical net positioning. Similar to the method of FIG. 1, a target layout pattern 205 is decomposed into a first pattern and a second pattern in block 210. Subsequently, a location where the first pattern overlaps with the second pattern is identified in block 215. At block 220 a splice is formed at the identified location by overlapping a portion of the first pattern with a portion of the second pattern. Next, at block 225, a critical net in the target layout pattern is identified. A critical net comprises of a feature of the layout that is likely to limit the overall circuit performance. An example of a critical net can include, but is not limited to, a transistor. In block 230 it is determined whether the critical net is in close proximity of a splice. If such is the case, the target layout pattern is changed to prevent the condition. The method of FIG. 2 can continue this process for some or all identified overlap locations. FIG. 10 designates two locations with dashed ovals (elements 801a and 802b from FIGS. 8a and 8b, respectively) where a critical net would be deemed in close proximity of a splice.

Figure 9:
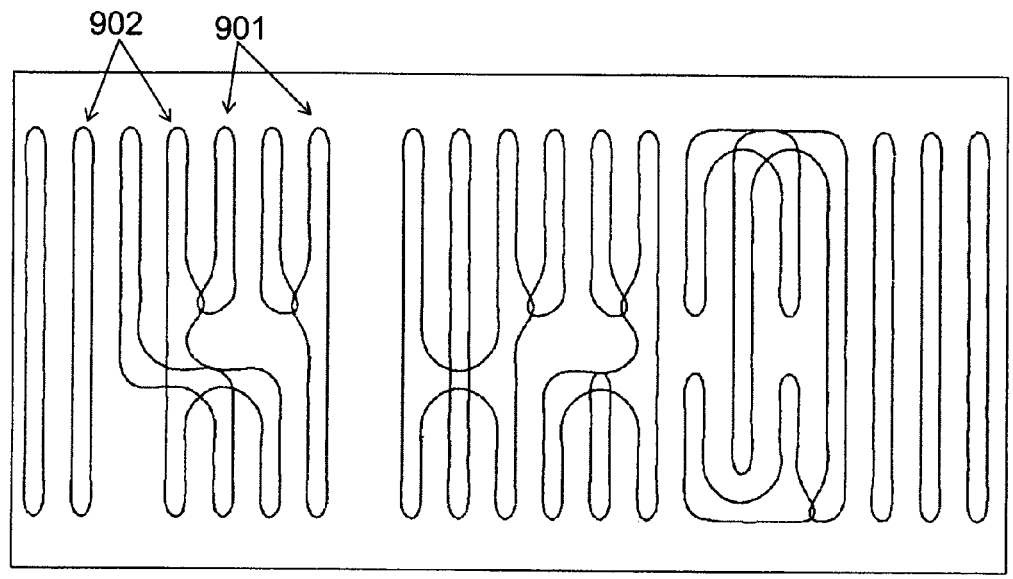
FIG. 9 is an etch contour of the first mask and second mask of the layout target pattern of FIG. 4.

FIG. 10 is the etch contour of the target layout pattern (FIG. 9) superimposed with the first pattern and the second pattern of FIG. 5. Element 901 designates contours of edges of the first pattern etched into a material and element 902 designates contours of edges of the second pattern etched into a material. On FIG. 10, elements 801a and 801b correspond to the locations of low image slope shown in FIGS. 8a and 8b where gates on a critical net should not be placed.

Figure 3:
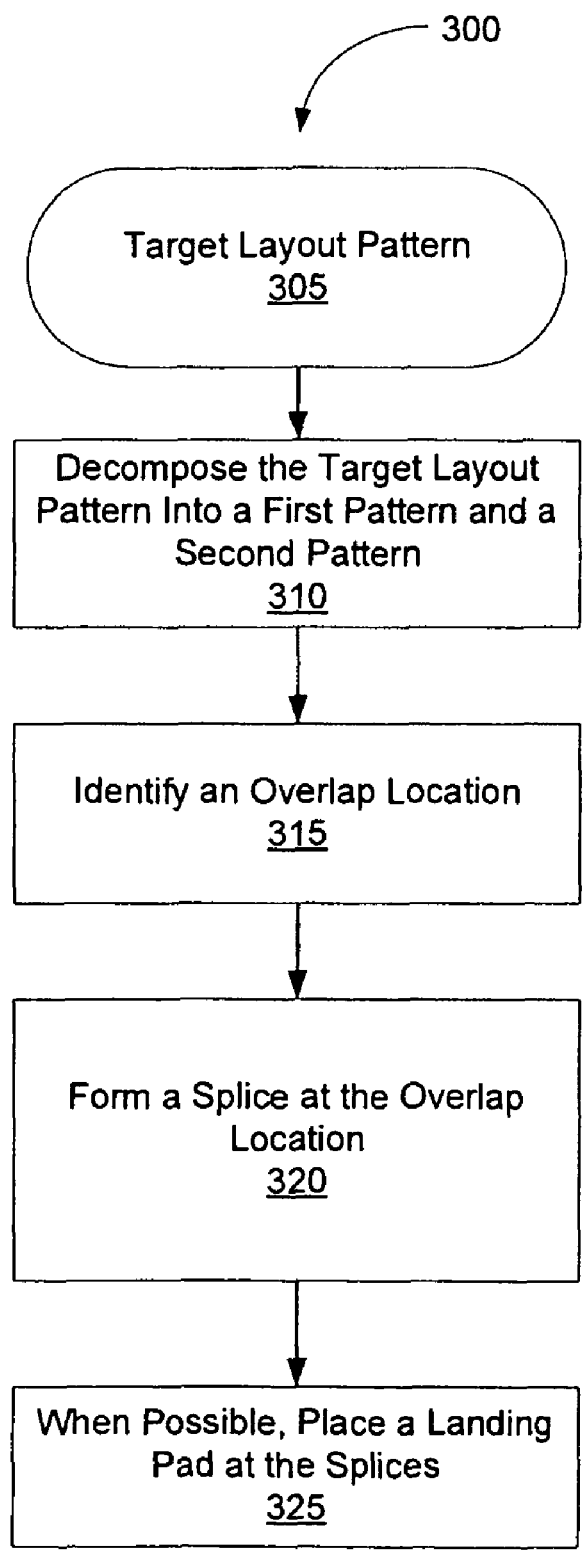
FIG. 3 is a flowchart illustrating an example method for double patterning lithography utilizing landing pads at splice locations.

FIG. 3 is a flowchart illustrating an example method for double patterning lithography utilizing landing pads at splice locations. In FIG. 3, the target layout pattern 305 is decomposed into a first pattern and second pattern at block 310. Next, a location where the first pattern and the second pattern overlap is identified at block 315 and a splice is formed at the location in block 320. The splice is formed by overlapping a portion of the first pattern and a portion of the second pattern. Finally, at block 325, when possible, a landing pad of contacts or vias is co-located with the splice. The method of FIG. 3 continues this process for all identified overlap locations.

The term substrate can be used to refer to any material onto which a layer of material is disposed. Substrates can be comprised of any of a number of materials or combinations of materials including metals, ceramics, plastics, glass and other materials. Substrates can include semiconductor substrates such as, for example, GaAs, Si, SiGe or any other semiconductor material, and can include, for example, wafers and dice or any other semiconductor structures, including structures in the process of fabrication, having one or more layers formed thereon.

Figure 11:
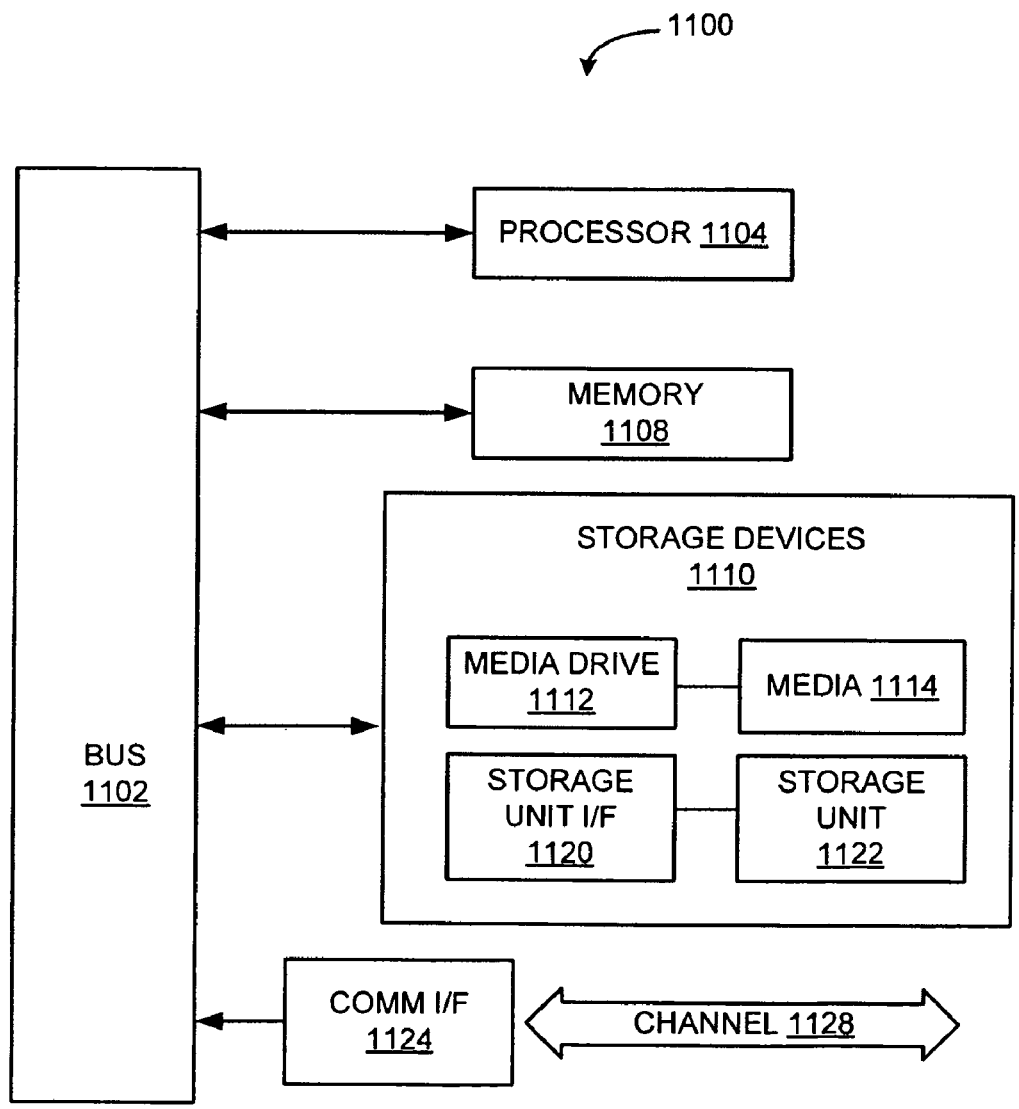
FIG. 11 is a diagram illustrating a computer system that can be used in conjunction with the systems and methods described herein.

The term tool can be used to refer to any apparatus configured to perform a recited function. For example, tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented.

Where components or modules of processes used in conjunction with the operations described herein are implemented in whole or in part using software, in one embodiment, these software elements can be implemented to operate with a computing or processing module capable of carrying out the functionality described with respect thereto. One such example-computing module is shown in FIG. 11. Various embodiments are described in terms of this example-computing module 1100. After reading this description, it will become apparent to a person skilled in the relevant art how to implement the invention using other computing modules or architectures.

Referring now to FIG. 11, computing module 1100 may represent, for example, computing or processing capabilities found within desktop, laptop and notebook computers; mainframes, supercomputers, workstations or servers; or any other type of special-purpose or general-purpose computing devices as may be desirable or appropriate for a given application or environment. Computing module 1100 might also represent computing capabilities embedded within or otherwise available to a given device. For example, a computing module might be found in other electronic devices. Computing module 1100 might include, for example, one or more processors or processing devices, such as a processor 1104. Processor 1104 might be implemented using a general-purpose or special-purpose processing engine such as, for example, a microprocessor, controller, or other control logic.

Computing module 1100 might also include one or more memory modules, referred to as main memory 1108. For example, preferably random access memory (RAM) or other dynamic memory, might be used for storing information and instructions to be executed by processor 1104. Main memory 1108 might also be used for storing temporary variables or other intermediate information during execution of instructions to be executed by processor 1104. Computing module 1100 might likewise include a read only memory ("ROM") or other static storage device coupled to bus 1103 for storing static information and instructions for processor 1104.

The computing module 1100 might also include one or more various forms of information storage mechanism 1110, which might include, for example, a media drive 1112 and a storage unit interface 1120. The media drive 1112 might include a drive or other mechanism to support fixed or removable storage media 1114. For example, a hard disk drive, a floppy disk drive, a magnetic tape drive, an optical disk drive, a CD or DVD drive (R or RW), or other removable or fixed media drive. Accordingly, storage media 1114, might include, for example, a hard disk, a floppy disk, magnetic tape, cartridge, optical disk, a CD or DVD, or other fixed or removable medium that is read by, written to or accessed by media drive 1112. As these examples illustrate, the storage media 1114 can include a computer usable storage medium having stored therein particular computer software or data.

In alternative embodiments, information storage mechanism 1110 might include other similar instrumentalities for allowing computer programs or other instructions or data to be loaded into computing module 1100. Such instrumentalities might include, for example, a fixed or removable storage unit 1122 and an interface 1120. Examples of such storage units 1122 and interfaces 1120 can include a program cartridge and cartridge interface, a removable memory (for example, a flash memory or other removable memory module) and memory slot, a PCMCIA slot and card, and other fixed or removable storage units 1122 and interfaces 1120 that allow software and data to be transferred from the storage unit 1122 to computing module 1100.

Computing module 1100 might also include a communications interface 1124. Communications interface 1124 might be used to allow software and data to be transferred between computing module 1100 and external devices. Examples of communications interface 1124 might include a modem or softmodem, a network interface (such as an Ethernet, network interface card, WiMedia, 802.XX or other interface), a communications port (such as for example, a USB port, IR port, RS232 port Bluetooth interface, or other port), or other communications interface. Software and data transferred via communications interface 1124 might typically be carried on signals, which can be electronic, electromagnetic, optical or other signals capable of being exchanged by a given communications interface 1124. These signals might be provided to communications interface 1124 via a channel 1128. This channel 1128 might carry signals and might be implemented using a wired or wireless medium. Some examples of a channel might include a phone line, a cellular link, an RF link, an optical link, a network interface, a local or wide area network, and other wired or wireless communications channels.

In this document, the terms "computer program medium" and "computer usable medium" are used to generally refer to media such as, for example, memory 1108, storage unit 1120, media 1114, and signals on channel 1128. These and other various forms of computer program media or computer usable media may be involved in carrying one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 1100 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the operations are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

A group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the invention may be described or claimed in the singular, the plural is contemplated to be within the scope thereof unless limitation to the singular is explicitly stated.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A method of lithography, comprising:
   receiving a first dataset defining a target layout pattern for a layer, wherein the target layout pattern is configured to be patterned onto a substrate by a photolithography process;
   decomposing the target layout pattern into a plurality of patterns for the layer, wherein the plurality of patterns is represented by a second dataset and the patterns are printable in a separate photolithography operation;
   using the second dataset to identify an overlap location where a first pattern overlaps with a second pattern;
   using a computer system to modify the second dataset to define a continuous junction between features of the first pattern at the overlap location.

2. The method of claim 1, further comprising, determining whether a continuous junction can be used at the location before modifying the second dataset.

3. The method of claim 2, further comprising, modifying the second dataset as having a splice at a location where a continuous junction is not used.

4. The method of claim 1, further comprising:
   identifying a splice between the first and second patterns at the overlap location;
   identifying a critical net in the target layout pattern that is in close proximity of the splice; and
   revising the second dataset to separate the splice and the critical net.

5. The method of claim 4, wherein revising the second dataset comprises moving the critical net such that it is no longer in close proximity of the splice.

6. The method of claim 5, wherein revising the second dataset comprises replacing the splice with a continuous junction.

7. The method of claim 5, wherein revising the second dataset comprises redefining the target layout pattern such that the splice is not near the critical net.

8. The method of claim 5, wherein revising the second dataset comprises moving the splice such that it is no longer in close proximity of the critical net.

9. The method of claim 1, wherein the method is performed by a computer program product having computer readable program code functions embedded in a non-transitory computer useable medium.

10. A method of lithography, comprising:
    receiving a first dataset defining a target layout pattern for a layer, wherein the target layout pattern is configured to be patterned onto a substrate by a photolithography process;
    decomposing the target layout pattern into a plurality of patterns for the layer, wherein the plurality of patterns is represented by a second dataset and the patterns are printable in a separate photolithography operation;

using the second dataset to identify an overlap location where a first pattern overlaps with a second pattern;

using a computer system to modify the second dataset to define a splice at the overlap location by overlapping a portion of the second pattern over a portion of the first pattern; and co-locating a landing pad with the splice when possible.

11. The method of claim 10, wherein the landing pad comprises contacts.

12. The method of claim 10, wherein the landing pad comprises vias.

13. The method of claim 10, wherein the method is performed by a computer program product having computer readable program code functions embedded in a non-transitory computer useable medium.

14. A computer aided design apparatus for generating a data file for a layer of a semiconductor device, comprising:
a processor;
a memory connected to the processor; and
a non-transitory computer readable medium having computer program code embedded therein, the computer program code configured to cause the processor to perform the operations of:
receiving a first dataset defining a target layout pattern for a layer, wherein the target layout pattern is configured to be patterned onto a substrate by a photolithography process;
decomposing the target layout pattern into a plurality of patterns for the, wherein the plurality of patterns is represented by a second dataset and the patterns are printable in a separate photolithography operation;
using the second dataset to identify an overlap location where a first pattern overlaps with a second pattern;
modifying the second dataset to define a continuous junction between features of the first pattern at the overlap location.

15. The computer aided design apparatus of claim 14, wherein the computer program code further performs the operation of determining whether a continuous junction can be used at the location before modifying the second dataset.

16. The computer aided design apparatus of claim 15, wherein the computer program code further performs the operation of modifying the second dataset as having a splice at a location where a continuous junction is not used.

17. The computer aided design apparatus of claim 14, wherein the computer program code further performs the operations of:

identifying a splice between the first and second patterns at the overlap location;
identifying a critical net in the target layout pattern that is in close proximity of the splice; and
revising the second dataset to separate the splice and the critical net.

18. The computer aided design apparatus of claim 17, wherein revising the second dataset comprises moving the critical net such that it is no longer in close proximity of the splice.

19. The computer aided design apparatus of claim 17, wherein revising the second dataset comprises replacing the splice with a continuous junction.

20. The computer aided design apparatus of claim 17, wherein revising the second dataset comprises redefining the target layout pattern such that the splice is not near the critical net.

21. The computer aided design apparatus of claim 17, wherein revising the second dataset comprises moving the splice such that it is no longer in close proximity of the critical net.

22. A computer aided design apparatus for generating a data file for a layer of a semiconductor device, comprising:
a processor;
a memory connected to the processor; and
a non-transitory computer readable medium having computer program code embedded therein, the computer program code configured to cause the processor to perform the operations of:
receiving a first dataset defining a target layout pattern for a layer, wherein the target layout pattern is configured to be patterned onto a substrate by a photolithography process;
decomposing the target layout pattern into a plurality of patterns for the layer, wherein the plurality of patterns is represented by a second dataset, and the patterns are printable in a separate photolithography operation;
using the second dataset to identify an overlap location where a first pattern overlaps with a second pattern;
modifying the second dataset to define a splice at the overlap location by overlapping a portion of the second pattern over a portion of the first pattern; and
co-locating a landing pad with the splice when possible.

23. The computer aided design apparatus of claim 22, wherein the landing pad comprises contacts.

24. The computer aided design apparatus of claim 22, wherein the landing pad comprises vias.

* * * * *